United States Patent

Lepselter

[15] 3,663,279

[45] May 16, 1972

[54] PASSIVATED SEMICONDUCTOR DEVICES

[72] Inventor: Martin P. Lepselter, New Providence, N.J.

[73] Assignee: Bell Telephone Laboratories, Incorporated, Murray Hill, Berkeley Heights, N.J.

[22] Filed: Nov. 19, 1969

[21] Appl. No.: 878,105

[52] U.S. Cl. .................................117/212, 117/217, 204/56

[51] Int. Cl. ..........................................................H01l 7/00

[58] Field of Search ..................117/212, 215, 217; 317/234, 317/3, 3.1, 46; 204/56

[56] References Cited

UNITED STATES PATENTS

| | | | |
|---|---|---|---|
| 3,445,732 | 5/1969 | Janning | 317/235 X |
| 3,442,701 | 5/1969 | Lepselter | 317/235 X |
| 3,438,873 | 4/1969 | Schmidt | 317/235 X |
| 3,432,405 | 3/1969 | Pilling et al. | 317/235 X |
| 3,396,052 | 8/1968 | Rand | 317/235 |
| 3,386,894 | 6/1968 | Steppat | 117/212 X |
| 3,385,729 | 5/1968 | Larchlan | 317/235 X |
| 3,373,051 | 3/1968 | Cho et al. | 317/235 X |
| 3,350,222 | 10/1967 | Ames et al. | 117/212 |
| 3,345,210 | 10/1967 | Wilson | 117/212 |
| 3,343,049 | 9/1967 | Miller et al. | 317/235 X |
| 3,337,438 | 8/1967 | Gobeli et al. | 117/201 X |

*Primary Examiner*—Ralph S. Kendall
*Assistant Examiner*—Alan Grimaldi
*Attorney*—R. J. Guenther and Arthur J. Torsiglieri

[57] ABSTRACT

Coatings of refractory metal oxides are provided over the surface of semiconductor devices for chemical and mechanical passivation. The oxide coatings are formed by depositing a layer of refractory metal and oxidizing in situ. In a specific example, the refractory metal is zirconium.

6 Claims, 8 Drawing Figures

INVENTOR
M. P. LEPSELTER
BY
A. J. Torsiglieri
ATTORNEY

PASSIVATED SEMICONDUCTOR DEVICES

BACKGROUND OF THE INVENTION

1. Field of the Invention

This invention relates to semiconductor devices, and, more particularly, to the provision of protective coatings for the mechanical and chemical passivation of such devices.

2. Description of the Prior Art

In semiconductor devices which have one or more PN junctions that extend to a surface thereof it is generally desirable to provide some degree of chemical passivation on the surface to ensure and preserve the integrity of the operating characteristics of those PN junctions. Providing such passivation has been a constant problem in the art; and complex manufacturing techniques have evolved to cope with the problem.

In addition to surface passivation it is generally desirable to provide some form of protection for the electrodes, particularly to prevent the formation of adsorbed moisture which can act as an electrolyte for interelectrode plating, and to prevent particulate contamination which can cause electrical shorts between electrodes.

Coatings of phosphorous doped silicon oxide and/or silicon nitride have been provided by some fabricators to provide chemical passivation of the surface. Various types of rubbers, e.g., silicone rubber, and glasses, e.g., borosilicate glasses, have been used to provide mechanical protection for the electrodes.

While the various techniques mentioned above and others have been moderately successful in protecting semiconductor devices for some purposes, they have not proved as successful as desired for many applications. More particularly, some require unduly complex fabrication procedures; others require unduly high formation temperatures which tend to degrade the semiconductor device in one way or another; others tend not to adhere to the semiconductor as well as desired; and still others are simply too bulky for the microminiaturized integrated circuits of the present and the future.

SUMMARY OF THE INVENTION

It is an object of this invention to provide a new and improved protective coating for the mechanical and chemical passivation of semiconductor devices.

It is a further object of this invention to provide such a coating through fabrication at relatively low temperatures.

It is yet another object of this invention to provide an improved barrier against ionic contamination of semiconductor surfaces.

Through radioactive tracer experiments I have discovered that zirconium oxide is a barrier against sodium ion penetration. Other refractory metal oxides, e.g., tantalum oxide, titanium oxide, hafnium oxide, vanadium oxide, and uranium oxide, also should be useful.

In accordance with my invention there is provided a coating of one or more of these refractory metal oxides over the surface of a semiconductor device, including over the electrodes. In general it is desirable to avoid coating certain portions of the electrodes so that ohmic connections can be made thereto for interconnection with other circuit elements.

In a particular embodiment of my invention there is provided a semiconductor device which comprises a semiconductor body having a surface over which a first dielectric coating is disposed. This first dielectric coating includes a pattern of voids through which conductive electrodes extend to make ohmic contact to portions of the semiconductor surface. The electrodes extend through the voids and over the first dielectric coating in overlay contact fashion. A second dielectric coating extends over the first coating and over substantially all of the electrodes (except where ohmic connection is to be made thereto) to provide the chemical and mechanical passivation for the device. Both the first and second coating or only the second coating may comprise the refractory metal oxides mentioned hereinabove.

I apply these refractory metal oxide coatings in the following manner. A thin layer of the refractory metal is deposited over the portion of the surface to be coated by deposition techniques well known in the art, e.g., evaporation or sputtering. Then the metal is removed from those portions in which the dielectric coating is not desired and the remaining portions of the refractory metal are converted in situ to an oxide of that metal. This conversion may be effected through heating in an oxidizing atmosphere, but is preferably done at lower temperatures by an anodic oxidation procedure such as is described, for example, in U.S. Pat. No. 3,337,438 to G. W. Gobeli et al., issued Aug. 22, 1967.

BRIEF DESCRIPTION OF THE DRAWING

The foregoing and other objects, features, and advantages of this invention will be better understood from the following more detailed description taken in conjunction with the accompanying drawing, in which.

It will be appreciated that for clarity and simplicity of illustration FIGS. 1 through 8 have not necessarily been drawn to scale.

DETAILED DESCRIPTION

Figure 1:
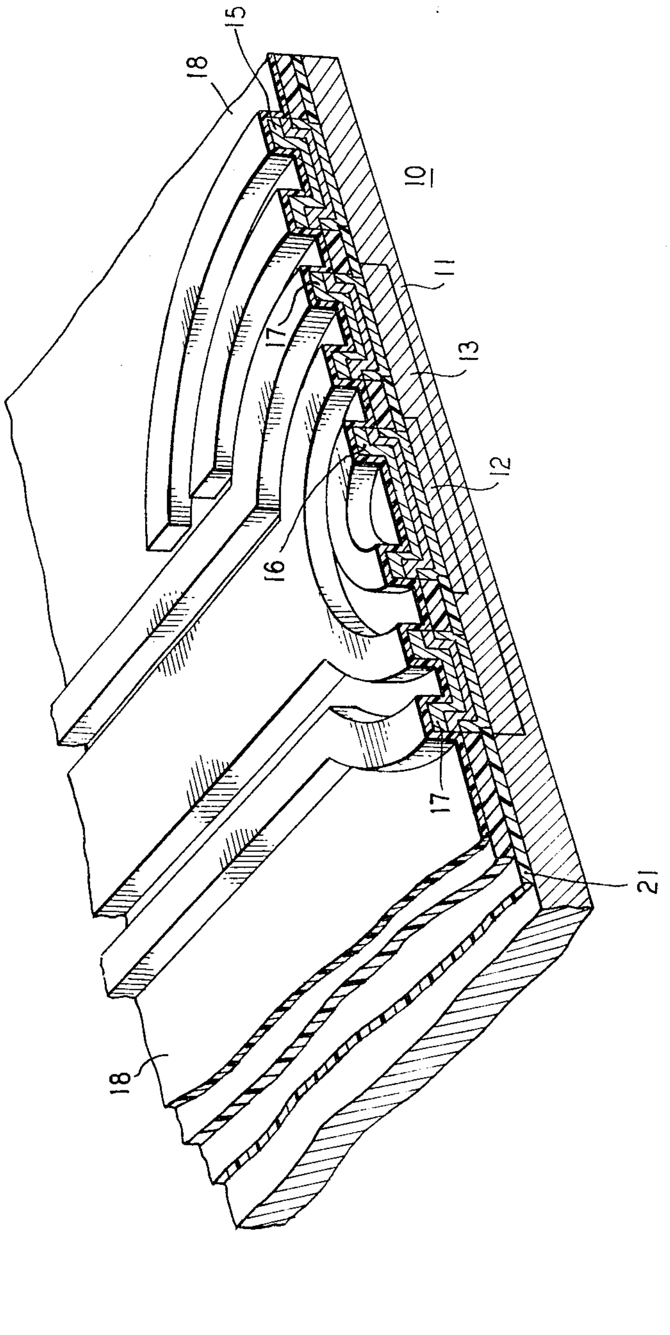
FIG. 1 shows an isometric cross section of a semiconductor device passivated by a protective coating in accordance with my invention.

Referring more particularly now to the drawing, FIG. 1 shows an isometric cross section of a semiconductor device 10 passivated by a protective coating 18 in accordance with my invention. For illustration, device 10 is shown as a semiconductive bulk portion 11 having localized conductivity-type zones 12 and 13 therein. Metallic electrodes 15, 16, and 17 provide electrical contact to the bulk 11 and to zones 12 and 13, respectively. Protective coating 18 provides passivation in accordance with my invention. As shown, coating 18 extends completely over the surface, although it can be appreciated, as previously mentioned, that openings will need to be provided to permit ohmic connection to each of the electrodes so that the device can be interconnected into its utilization circuit.

More specifically now, FIGS. 2–8 show cross sections of device 10 of FIG. 1 substantially as it appears following successive stages of fabrication in accordance with my invention.

Figure 2:
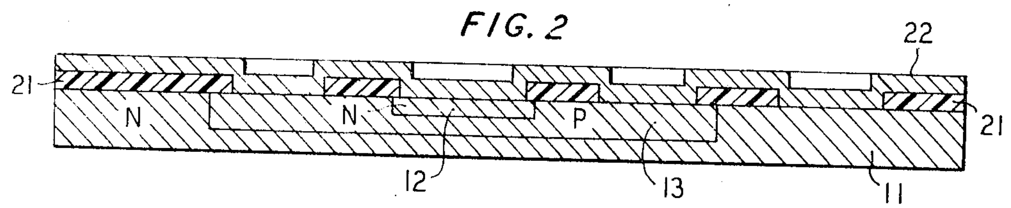
FIGS. 2 through 8 show cross sections of the device of FIG. 1 substantially as it appears following successive stages of fabrication in accordance with my invention.

As shown in FIG. 2, localized conductivity-type zones 12 and 13, e.g., N and P, respectively, are formed into bulk portion 11 by any of a variety of techniques well known in the art, e.g., diffusion or ion implantation. A dielectric mask 21 is formed thereover with voids through which electrical contact to the semiconductive portions can be made.

A variety of electrode-forming techniques can be used; but, preferably, I begin by first depositing and then sintering a thin layer of platinum to form platinum silicide, where there are voids in the dielectric mask, to promote forming a good electrical contact to the semiconductor exposed through the voids. Then the platinum is removed from those areas in which it was not converted to platinum silicide. This part of the process is described in more detail in my U.S. Pat. No. 3,274,670, issued Sept. 27, 1966, and assigned to the assignee hereof.

Then, as shown in FIG. 2 I form a continuous, thin, and substantially uniform layer 22 of a refractory metal over the surface. Layer 22 is contiguous with the upper surface of dielectric 21 and contiguous with the semiconductor surface where there are voids in layer 21. Layer 22 may be formed by sputtering or evaporation or by other deposition techniques and advantageously is about 1,000 A. or more in thickness. Layer 22 preferably is of zirconium, but other refractory metals which should be useful include tantalum, titanium, vanadium, hafnium, and uranium.

Figure 3:
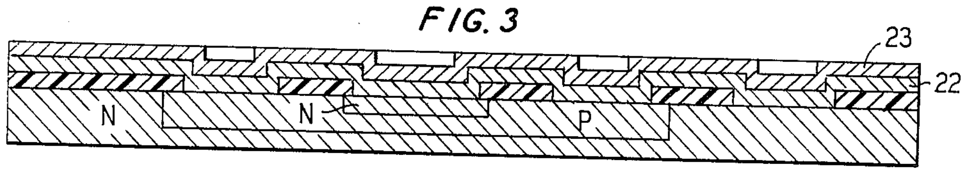
Figure 4:
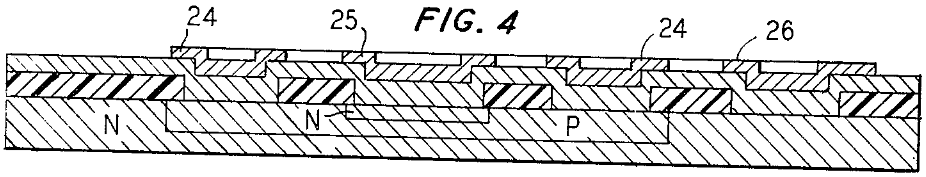
Figure 5:
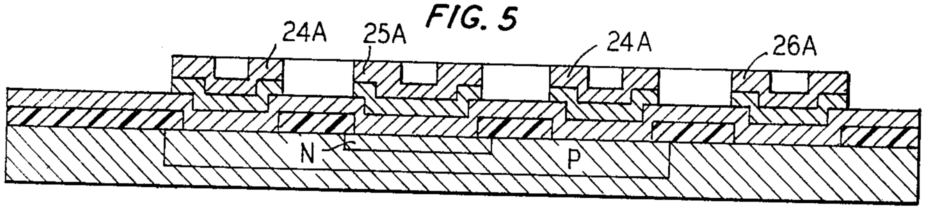

FIGS. 3–5 illustrate the formation of multilayered electrodes, such as, for example, beam lead electrodes as described in my U.S. Pat. No. 3,426,252, issued Feb. 4, 1969, and assigned to the assignee hereof. Of course, other types of electrodes may be used, but the zirconium-platinum-gold electrode described herein is preferred.

As shown in FIG. 3, a continuous, thin, and substantially uniform layer 23, e.g., of platinum, is formed over zirconium layer 22. Then, as shown in FIG. 4, portions of layer 23 are removed so that at least some of the remaining portions 24, 25, and 26 conform to a desired electrode and interconnection pattern. This selective removal of portions of layer 23 can be accomplished through photolithographic techniques or by other techniques well known in the art.

Next, as shown in FIG. 5, a layer of gold 24A, 25A, and 26A, or other suitable electrode metal, e.g., aluminum, is formed over each of the remaining platinum portions 24, 25, and 26. This selective gold formation can be accomplished by electroplating through a photoresist mask or by other techniques well known in the art.

Figure 6:
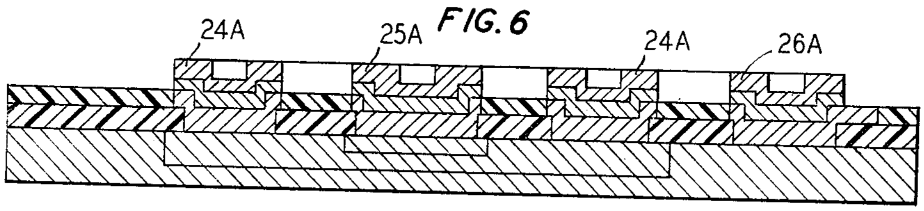

Then, as shown in FIG. 6, the uncovered portions of zirconium layer 22 are completely converted to zirconium oxide, a dielectric, to provide electrical isolation between the electrodes. As disclosed in my U.S. Pat. No. 3,442,701, issued May 6, 1969, this selective chemical conversion can be accomplished by heating in an oxidizing atmosphere, e.g., 400° C in air for about 6 hours. Preferably, however, the conversion is accomplished by a lower temperature anodic oxidation process such as disclosed in U.S. Pat. No. 3,337,438 to G. W. Gobeli et al., mentioned hereinabove.

Briefly, anodic oxidation is carried out by immersing the subject to be oxidized in a moderate density oxygen glow discharge. It is thought that the negative oxygen ion is responsible for the oxidation observed and that the ionized gas discharge or plasma is rich in this ion species. Oxide films of limited thickness can be grown merely by immersing the subject to be oxidized in the plasma. However, if a potential is applied across the plasma and the subject to be oxidized is at the positive pole (anode) of that potential, negative ions are extracted from the plasma and the oxide film grows at an accelerated parabolic rate and to a greater thickness.

The lower temperature conversion is desirable because it minimizes thermally caused redistribution of dopant impurities within the semiconductor device and because it reduces intermetallic diffusion and alloying between metallic portions on the surface of the device.

Figure 7:
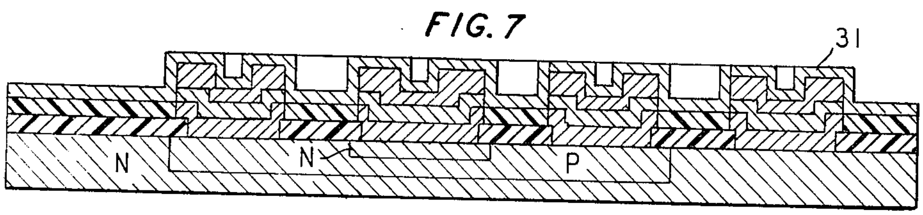

To complete the device, then, as shown in FIG. 7 in accordance with my invention, a thin layer 31, e.g., about 1,000 A., of a refractory metal such as zirconium, is formed completely over the device, e.g., by sputtering or evaporation.

Figure 8:
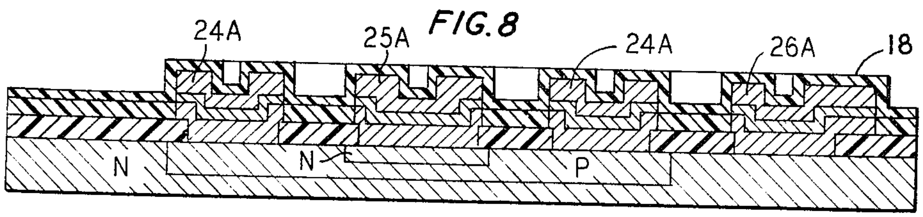

Finally, as shown in FIG. 8, metal layer 31 is converted in situ to an oxide of that metal to provide a dielectric, passivating coating over the device including over the electrodes. As mentioned hereinabove, it will be desirable in most cases to avoid forming the dielectric coating over selected portions of some or all of the electrodes so that ohmic connections can be made thereto for interconnection with other circuit elements. This is accomplished simply by selectively removing portions of layer 31 prior to the chemical conversion.

One caveat is to be observed. In the structure in FIG. 8 portions of the zirconium layer are in contact with the gold portions 24A, 25A, and 26A. If one attempts thermally to convert the zirconium to its oxide, i.e., by heating in an oxidizing atmosphere at any temperature greater than about 350° C, much of the zirconium will diffuse into the gold and vice versa so that a satisfactory zirconium oxide layer will not be formed. Anodic oxidation is most advantageously used.

Alternatively, if it is desired to oxidize layer 31 thermally at temperatures in excess of 350° C, one can form a thin layer, e.g., 1,000–2,000 A. of platinum over the gold electrodes 24A, 25A, and 26A before the layer 31 is formed. Then, during thermal conversion of layer 31, the platinum acts as a barrier to prevent interdiffusion between layer 31 and electrodes 24A, 25A, and 26A.

Although the invention has been described in terms of certain specific embodiments, it will be understood that these are merely illustrative and that other arrangements may be devised by those skilled in the art without departing from the spirit and scope of this invention.

I claim:

1. A method of fabricating a semiconductor device comprising the steps of:

forming on the surface of a semiconductor body a silicon oxide mask such that the unmasked portions of the semiconductor body are those portions of the surface of the body to which it is desired to make electrical contact;

forming a first layer comprising a substantially uniform coating of a first metal over both the silicon oxide and the unmasked portions of the semiconductor body, the first metal selected from the group consisting of zirconium, tantalum, titanium, vanadium, hafnium, and uranium;

forming a second layer of a second metal on top of the first layer, the second metal being such that it protects the first layer and does not oxidize substantially during subsequent treatment of the first layer;

removing portions of the second layer such that the remaining portions of the second metal conform to the desired electrode and interconnection pattern;

converting all those portions of the first metal not under the remaining portions of the second metal to an oxide of the first metal;

forming over substantially all of the oxide of the first metal and over substantially all portions of the electrodes a third layer of a third metal, the third metal selected from the group consisting of zirconium, tantalum, titanium, vanadium, hafnium, and uranium; and converting completely the third layer to an oxide of the third metal.

2. A method as recited in claim 1 wherein the conversion of the third layer to an oxide of the third material is accomplished by anodic oxidation.

3. A semiconductor device fabricated in accordance with the method of claim 1.

4. A method as recited in claim 1 wherein the first metal is the same as the third metal.

5. A method as recited in claim 4 wherein the first metal and the third metal each are zirconium.

6. A semiconductor device fabricated in accordance with the method of claim 5.

* * * * *